United States Patent [19]
Gehner et al.

[11] Patent Number: 5,486,851
[45] Date of Patent: Jan. 23, 1996

[54] ILLUMINATION DEVICE USING A PULSED LASER SOURCE A SCHLIEREN OPTICAL SYSTEM AND A MATRIX ADDRESSABLE SURFACE LIGHT MODULATOR FOR PRODUCING IMAGES WITH UNDIFRACTED LIGHT

[75] Inventors: Andreas Gehner; Günther Hess; Heinz Kück, all of Duisburg; Holger Vogt, Mülheim, all of Germany

[73] Assignee: Fraunhofer-Gesellschaft zur Forderung der Angewandten Forschung E.V., Munich, Germany

[21] Appl. No.: 232,005

[22] PCT Filed: Oct. 30, 1991

[86] PCT No.: PCT/DE91/00859

§ 371 Date: Jul. 19, 1994

§ 102(e) Date: Jul. 19, 1994

[87] PCT Pub. No.: WO93/09469

PCT Pub. Date: May 13, 1993

[51] Int. Cl.[6] .................................................. G03B 27/54
[52] U.S. Cl. ........................... 347/258; 347/241; 347/242
[58] Field of Search .................................. 346/108, 160, 346/107 R; 355/73; 353/98; 347/241, 242, 258

[56] References Cited

U.S. PATENT DOCUMENTS

| | | | |
|---|---|---|---|
| 3,580,126 | 5/1971 | Forkner | 353/98 |
| 3,729,252 | 4/1973 | Nelson | 350/112 SF |
| 3,785,736 | 1/1974 | Spitz et al. | 356/71 |
| 3,930,684 | 1/1976 | Lasch, Jr. et al. | 355/73 |
| 4,592,648 | 6/1986 | Tabarelli et al. | 355/43 |
| 4,675,702 | 6/1987 | Gerber | 346/107 R |
| 4,728,185 | 3/1988 | Thomas | 353/122 |
| 5,296,891 | 4/1994 | Vogt et al. | 347/258 |

OTHER PUBLICATIONS

Proceedings of SPIE, Band. 1018, 1988 W. Brinker et al.: "Deformation behavior of thin viscoelastic layers used in an activematrix-addressed spatial light modulator", pp. 79–85.

Primary Examiner—Benjamin R. Fuller
Assistant Examiner—Raquel Yvette Gordon
Attorney, Agent, or Firm—Wolf, Greenfield & Sacks

[57] ABSTRACT

An illumination device for producing models used for manufacturing electronic elements, or for direct illumination of wafers or substrates during the photolithographic steps required for their production, or for direct illumination of structures including light-sensitive layers, comprises a pulsed laser light source and a pattern generator.

The pattern generator includes an optical Schlieren system and an active, matrix-addressable surface light modulator. The Schlieren system comprises a Schlieren lens arranged on a side of the surface light modulator, a projection lens facing away from the surface light modulator, and a mirror device which is arranged between the lenses for directing light coming from the light source onto the reflective surface on the surface light modulator. The Schlieren lens is arranged from the surface light modulator at a short distance relative to the focal length of the lens. A filter device is arranged in the diffraction image plane of the virtual point light source between the Schlieren lens and the projection lens, the filter device having a structural design of such a nature that it will either filter out the diffracted light reflected by the addressed surface areas of the surface light modulator or that it will filter out the undiffracted light. During the displacement of a positioning table, the model, the disk, the substrate or structure are composed of a plurality of partial images by adequate addressing of the surface light modulator.

13 Claims, 4 Drawing Sheets

ILLUMINATION DEVICE USING A PULSED LASER SOURCE A SCHLIEREN OPTICAL SYSTEM AND A MATRIX ADDRESSABLE SURFACE LIGHT MODULATOR FOR PRODUCING IMAGES WITH UNDIFFRACTED LIGHT

BACKGROUND OF THE INVENTION

The present invention refers to an illumination device or exposure device for producing models, such as reticles and masks, used for manufacturing electronic elements, or for direct illumination of wafers and substrates during the photolithographic steps required for production, or for direct illumination of structures including light-sensitive layers, said illumination or exposure device comprising a light source and a pattern generator.

The present invention especially deals with the production of models, reticles and masks, or with direct illumination in the micrometer range in the fields of semiconductor production, the production of integrated circuits, hybrid production and the production of flat screens as well as similar production methods in the case of which illumination processes are used. The present invention especially concerns an illumination device, which is adapted to be used for direct illumination of semiconductor wafers in the field of semiconductor production and for direct illumination of substrates in the field of hybrid and bonding technology.

For the production of reticles, which are illumination templates for the photolithographic production of circuits, as well as for the production of masks and for direct illumination of semiconductor products, electron beam writers, laser beam units and optical pattern generators including a laser light source or a mercury-vapour lamp are used. Optical pattern generators according to the prior art produce the desired structures by carrying out successive, individual illuminations of rectangular windows, which are defined by mechanical rectangular shields. The complexity of the structure to be produced determines the number of illumination rectangles required, and said number, in turn, determines the writing time or the exposure time for the structure. The accuracy of the structures which can be produced by these known pattern generators is, in turn, limited by the accuracy of the mechanical rectangular shields used.

In the case of laser beam units according to the prior art, the surface to be illuminated is rastered by a laser beam. The writing speed or illumination speed of such laser beam units is limited due to the serial data flow required for the rastering process. In addition, such laser beam units necessitate high mechanical-optical investments.

The electron beam units employed in the prior art can only be used for the illumination of electron-sensitive, special photoresist systems, and, in comparison with the above-described laser beam units, they additionally require the use of a high-vacuum technique. It follows that electron beam units necessitate very high capital expenditure and operating costs.

The technical publication B. W. Brinker et al, "Deformation behavior of thin viscoelastic layers used in an active, matrix-addressed spatial light modulator", Proceedings of SPIE 1989, vol. 1018, already discloses the use of a reflective optical Schlieren system including an active, matrix-addressed, viscoelastic surface light modulator for the purpose of producing television pictures or for the purpose of image display. This surface light modulator includes a permanent light source whose light falls vertically onto the surface of the surface light modulator through an appropriate optical system. Surface areas of the surface light modulator are adapted to be deformed in response to addressing of control electrodes so that the light falling onto the surface will be reflected as diffracted light in the case of addressed surface elements and as undiffracted light in the case of non-addressed surface elements. The undiffracted light will be returned to the light source, whereas the diffracted light will be used via the optical Schlieren system for image production on the television screen or on an image display area.

The company publication of the firm of Texas Instruments, JMF 008:0260; 10/87, discloses a surface light modulator whose reflective surface consists of a plurality of electrically addressable, mechanically deformable reeds.

The older, not prepublished international patent application now U.S. Pat. No. 5,296,891 describes an illumination device for producing models or for the direct illumination of electronic elements, said illumination device comprising a light source and a pattern generator. The pattern generator is provided with an optical Schlieren system and with an active, matrix-addressable surface light modulator having a viscoelastic control layer with a reflective surface. Between the Schlieren lens and the projection lens of the Schlieren system, a mirror device is arranged, which fulfills preferably a double function, said mirror device being used for deflecting the light coming from the light source onto the surface light modulator and serving as a filter device for filtering out undiffracted, reflected light. The Schlieren lens is arranged close to the surface light modulator. A positioning table, which is adapted to be displaced, serves to receive thereon the model or the electronic element. In this illumination device, the introduction of light from the light source via the mirror device onto the surface light modulator is effected with the aid of a focussing means, which is arranged in the beam path in front of the mirror device and which focusses the light coming from the light source onto the mirror device. In other words, a virtual point light source for illuminating the surface light modulator is necessarily produced at the location of the mirror device when this illumination device is used, and this will result in limitations with respect to the structural design of the illumination device and the arrangement of its mirror device as well as of its filter device.

U.S. Pat. No. A 4,675,702 discloses a surface exposure device, which can be used e.g. for exposing photosensitive films and which may be constructed as a "photoplotter". This exposure device comprises a light source for generating an essentially parallel bundle of light falling through a controllable light matrix valve, which can, for example, consist of a liquid crystal layer, whereby areas of the photosensitive film which are not to be exposed will be defined.

U.S. Pat. No. A 4,728,185 deals with a Schlieren imaging system, which can be used with light modulators in an optical printer. The light valves themselves can be constructed as electronically addressable surface light valves. The known illumination device is arranged in such a way that only the parts of the bar-shaped light modulator which are addressed will be imaged on a photosensitive layer.

U.S. Pat. No. A 4,592,648 discloses an illumination system which is used for forming an image of a model on a light-sensitive layer on a semiconductor material and which is provided with a displaceable positioning table.

SUMMARY OF THE INVENTION

Taking this prior art as a basis, it is the object of the present invention to provide an illumination device for producing models or for the direct illumination of electronic elements, said illumination device having a simple structure and permitting a reduced exposure time or writing time in comparison with laser beam systems or electron beam systems.

This object is achieved by an illumination device for producing models used for manufacturing electronic elements, or for direct illumination of wafers or substrates during the photolithographic steps required for their production, or for direct illumination of structures including light-sensitive layers, comprising:

a pulsed laser light source;

a pattern generator;

said pattern generator includes an optical Schlieren system and an active, matrix-addressable surface light modulator, said surface light modulator has a reflective surface having addressed surface areas which diffract incident light and non-addressed surface areas which reflect incident light, said Schlieren system comprises a Schlieren lens arranged on a side of said surface light modulator, a projection lens facing away from said surface light modulator, and a mirror device which is arranged between said lenses for directing light coming from said light source onto said reflective surface on said surface light modulator, wherein said Schlieren lens is arranged from said surface light modulator at a short distance relative to the focal length of said lens, a focussing means is provided for focussing the light coming from said light source in at least one point which is spaced apart from said mirror device and which is adapted to have associated therewith at least one virtual point light source by reflecting the point at said mirror device, a filter device is arranged in the diffraction image plane of the virtual point light source between said Schlieren lens and said projection lens, said filter device having a structural design of such a nature that it will either filter out the diffracted light reflected by the addressed surface areas of said surface light modulator and permit the undiffracted light, which is reflected by said non-addressed surface areas, to pass via said projection lens to the model, the disk, the substrate, or the structure, or that it will filter out the undiffracted light, which is reflected by said non-addressed surface areas of said surface light modulator, and permit said diffracted light reflected by said addressed surface areas to pass via said projection lens to the model, the disk, the substrate, or the structure, and a displaceable positioning table on which the model, the disk, the substrate or the structure can be secured in position in such a way that a sharp image of said surface areas of said surface light modulator can be formed on the model, this disk, the substrate, or on the structure, wherein said pulsed laser light source is constructed such that its pulse duration is shorter than the minimum structural dimension of the model, disk, substrate or structure to be produced divided by said displacement rate of said positioning table, and wherein, during the displacement of said positioning table, the model, the disk, the substrate or structure are composed of a plurality of partial images by adequate addressing of said surface light modulator.

According to the present invention, the illumination device for producing models used for manufacturing electronic elements, or for the direct illumination of wafers or substrates during the photolithographic steps required for their production, or for the direct illumination of structures including light-sensitive layers, comprises a light source and a pattern generator, which, in turn, includes an optical Schlieren system and an active, matrix-addressable surface light modulator. The surface light modulator is provided with a reflective surface whose addressed surface areas diffract incident light and whose non-addressed surface areas reflect incident light. The Schlieren system comprises a Schlieren lens arranged on the side of the surface light modulator, a projection lens facing away from the surface light modulator as well as a mirror device which is arranged between these lenses and which directs light coming from the light source onto the surface of the surface light modulator. The Schlieren lens is arranged at a distance from the surface light modulator which is short relative to the focal length of said lens. The illumination device includes a focussing device for focussing the light coming from the light source in at least one point which is spaced from the mirror device and which can have associated therewith at least one virtual point light source by reflecting the point at the mirror device. A filter device in the diffraction image plane of the virtual point light source between the Schlieren lens and the projection lens is provided with a structural design of such a nature that it will either filter out, in a socalled negative mode, the diffracted light reflected by the addressed surface areas of the surface light modulator and permit the undiffracted light, which is reflected by the non-addressed surface areas, to pass via the projection lens to the model, or to the electronic element, or to the structure, or that it will filter out, in a socalled positive mode, the undiffracted light, which is reflected by the non-addressed surface areas of the surface light modulator, and permit the diffracted light reflected by the addressed surface areas to pass via the projection lens to the model, or to the electronic element, or to the structure. The illumination device is additionally provided with a displaceable positioning table on which the model, or the electronic element, or the structure can be secured in position in such a way that a sharp image of the surface areas of the surface light modulator can be formed on the model, or on the electronic element, or on the structure.

According to an essential aspect of the present invention, the light source of the illumination device according to the invention is a pulsed laser light source whose pulse duration is shorter than the minimum dimension of the structure to be produced divided by the displacement rate of the positioning table. On the basis of this embodiment, the illumination device according to the present invention permits a stroboscopelike illumination of the model, or of the electronic element, or of the structure during an essentially continuous displacement of the positioning table, whereby very high writing speeds and exposure speeds are achieved.

In spite of the high illumination intensity of the individual laser light pulses, the present invention makes use of a surface light modulator of a type employed in the prior art only for cases of use in which the illumination intensity is very low, this being e.g. the case with television screens. However, in view of the fact that the laser light pulses of the illumination device according to the present invention are only pulses of short duration, the surface light modulator will still meet the thermal requirements. On the basis of the rapid programmability or addressability of the surface light modulator, said surface light modulator can be reprogrammed or readdressed during the displacement movement of the positioning table between two successive partial images of an overall structure to be produced. This will not only permit a short exposure pulse sequence in the case of direct illumination of semiconductor wafers with repetitive structures, but it will also permit the production of irregular structures on the basis of the rapid reprogrammability of the surface light modulator.

Further developments of the illumination device according to the present invention are disclosed in the subclaims.

BRIEF DESCRIPTION OF THE DRAWINGS

In the following, a preferred embodiment of the illumination device according to the present invention will be explained in detail with reference to the drawings enclosed, in which.

DESCRIPTION OF THE PREFERRED EMBODIMENT

Figure 1:
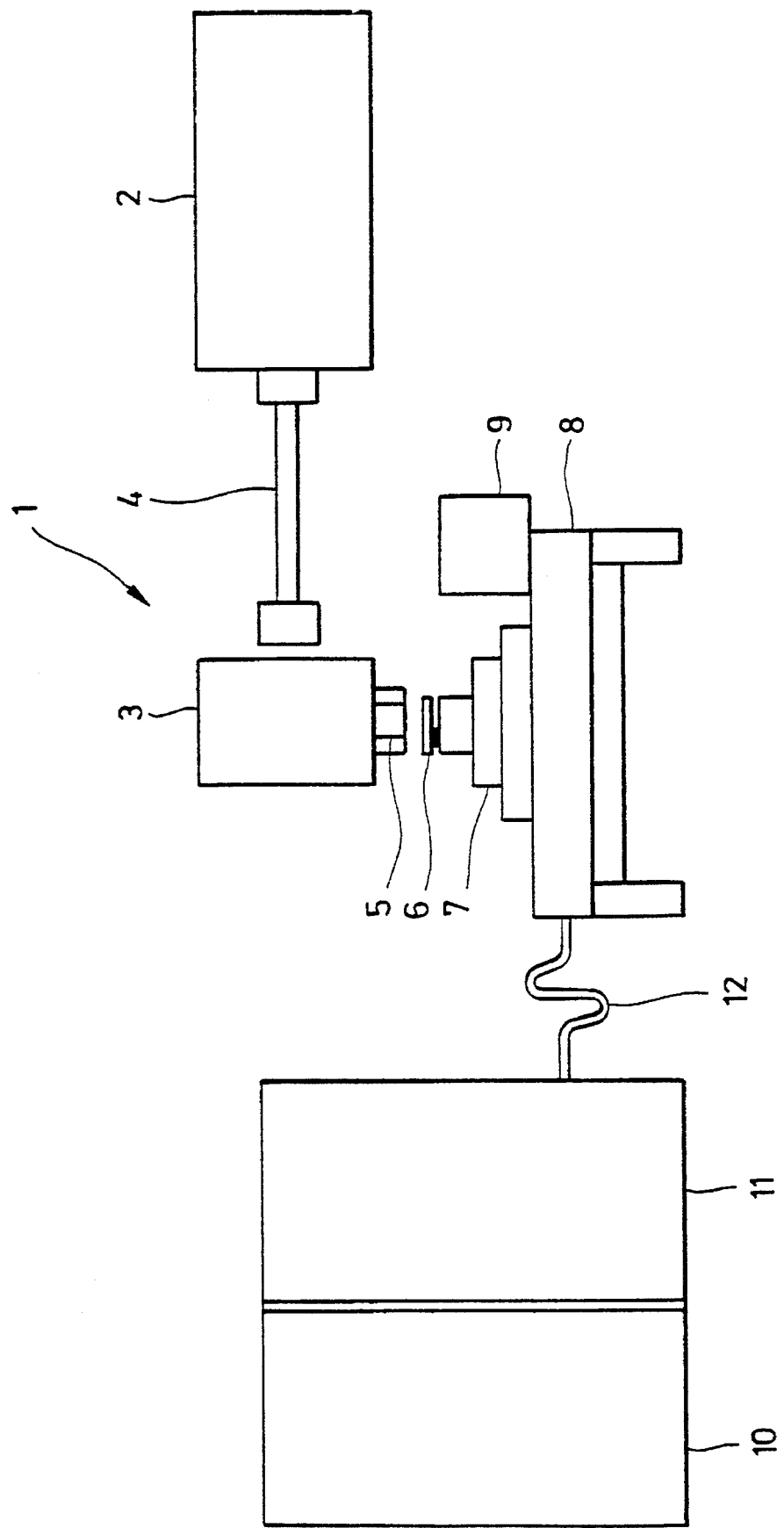
FIG. 1 shows a schematic representation of the total structure of the illumination device according to the present invention.

The illumination device shown in FIG. 1 is provided with reference numeral "1" in its entirety and serves to produce models, such as reticles and masks for the production of electronic elements, or to effect direct illumination of substrates or of structures with light-sensitive layers. The illumination device 1 according to the present invention includes an excimer laser light source 2. This excimer laser light source is a gas discharge laser device with wavelengths in the ultraviolet region of approx. 450 to 150 nm, which emits in a controllable manner light pulses with a very high light intensity per pulse and with a high repetition rate. The excimer laser light source 2 is connected to a pattern generator 3 via an illuminating optical unit 4. The illuminating optical unit 4 serves to supply the light coming from the excimer laser light source 2 to a surface light modulator 13, which forms part of the pattern generator 3 and which will be explained hereinbelow, in such a way that the light aperture of the excimer laser light source 2 will be adapted to the surface of the surface light modulator. In the case of preferred embodiments, which will be explained hereinbelow with respect to FIG. 2 and 3, the illuminating optical unit 4 is defined by lens systems whose structure is known per se.

By means of a projecting optical unit 5, the pattern generator forms an image of a pattern on a model 6 in a manner which will be described in detail hereinbelow, said model 6 being held by an x-y-θ positioning table.

The projecting optical unit 5 does not only serve to form on the model 6 an image of the pattern produced by the pattern generator 3, but it also serves to carry out a desired magnification or demagnification upon forming the image and, as far as this is desired, to autofocus the image on the model 6.

As has already been explained, the model can, for example, be reticles or masks. In the case of direct illumination, which has been explained at the beginning as well, the x-y-θ positioning table 7 carries, instead of the model 6, a semiconductor wafer to be illuminated, some other element which is to be produced by means of photolithography, or a structure with a light-sensitive layer which is to be written on or which is to be illuminated.

The positioning table 7 is arranged on a vibration-isolating support structure 8. This support structure 8 can have provided thereon a loading and unloading station 9 for additional models 6 or semiconductor elements, or for structures to be illuminated. The loading and unloading station 9 can be provided with a structural design which is normally used in the field of semiconductor production technology and which is suitable for automatically charging the positioning table 7 with the models or substrates to be illuminated or with other semiconductor elements.

A control computer 10 and the associated control electronics 11 carry out all control functions for the exposure device. The control computer 10 and the control electronics 11 especially communicate with the positioning table 7 for the purpose of computer-controlled position adjustment of the positioning table. The control computer 10 programmes and addresses, respectively, the pattern generator 3 in response to the respective control position of the positioning table 7 for successively producing partial images on the model 6 from which the exposed overall structure will result. A magnetic tape unit or an LAN interface (not shown) is used as a data carrier.

Figure 2:
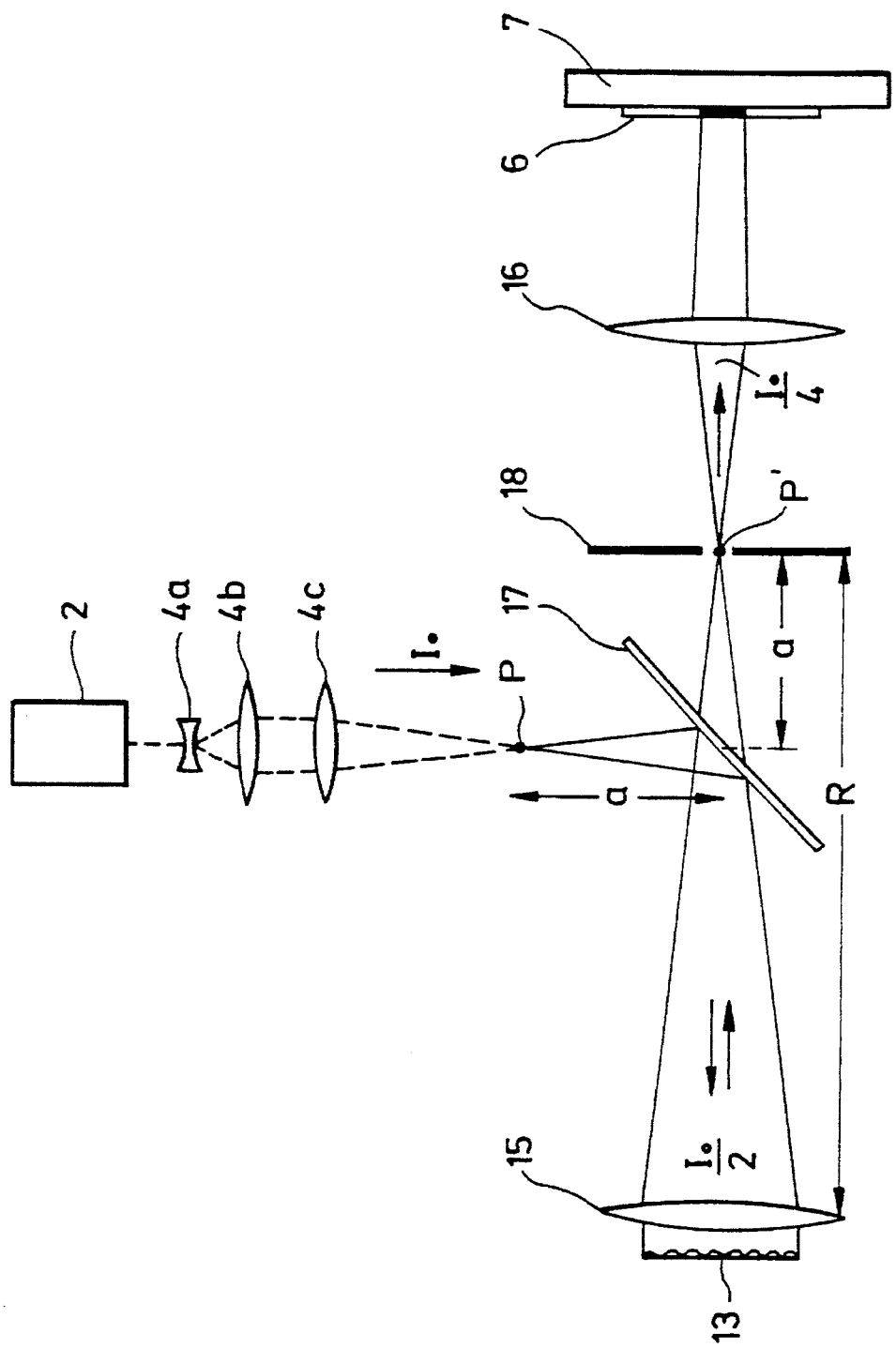
FIG. 2 shows a detailed representation of a first embodiment of the illumination device according to the present invention.

As can be seen in FIG. 2, the pattern generator 3 includes a surface light modulator 13, which can also be referred to as two-dimensional light modulator, as well as an optical Schlieren system comprising a Schlieren lens 15, which faces the surface light modulator 13, a projection lens 16, which faces away from the surface light modulator 13, and a mirror device 17, which is arranged between the Schlieren lens 15 and the projection lens 16. In the preferred embodiment disclosed, the mirror device is shown as a semireflecting mirror 17 which is arranged at a 45° angle relative to the optical axis of the lenses 15, 16 in such a way that the intersection point of the optical axis of the lenses 15, 16 with the semireflecting mirror 17 is displaced towards the Schlieren lens 15 by a distance a from the focal plane of said Schlieren lens 15. Relative to its focal length, the Schlieren lens 15 is, in turn, arranged at a short distance from the surface light modulator 13.

The illuminating optical unit, which is located in the beam path in front of the mirror device 17, includes, in addition to the excimer laser light source 2 which has already been mentioned, a beam expansion optical system 4a, 4b and a focussing optical system 4c which, in the preferred embodiment shown, focusses the light in a single point P; in the arrangement shown in the present connection where the light is introduced symmetrically with respect to the optical axis, the distance of this point P from the intersection point of the optical axis with the mirror device 17 corresponds to the distance a existing between said intersection point of the optical axis with the mirror device 17 and the focal plane of the Schlieren lens 15.

In other words, in the embodiment shown in the present connection, the mirror device 17 and the focussing device 4c are arranged in such a way that the focussing point P of the focussing means has associated therewith a virtual point light source P' due to the reflection of the point P at the mirror device 17, said virtual point light source P' being located in the focal plane of the Schlieren lens 15 in this embodiment. Hence, also the diffraction image of the virtual point light source P' is located in the focal plane of the Schlieren lens 15 so that a filter device 18 used for filtering out undesirable orders of diffraction and located in the diffraction image plane will be arranged in the focal plane of the Schlieren lens 15 in this embodiment.

In the embodiment according to FIG. 2, the focussing point P of the focussing device 4c is arranged relative to the mirror device 17 in such a way that the virtual point light source P' associated with the focussing point due to reflection is located in the focal plane of the Schlieren lens. Deviating from this structural design, the focussing point of the focussing device 4c can also be displaced in such a way that the virtual point light source P' associated therewith is, in comparison with the focal plane of the Schlieren lens 15, displaced further towards said Schlieren lens. This will have the effect that the diffraction image plane of the virtual point light source P' is displaced away from the focal plane of the Schlieren lens 15 towards the projection lens 16. In view of the fact that the filter device 18 has to be arranged in the diffraction image plane, also said filter device 18 of the presently described embodiment will have to be displaced further towards the projection lens 16 in comparison with the structural design shown in FIG. 2 so that said filter device 18 will then be located in the diffraction image plane.

The surface light modulator 13 comprises a viscoelastic control layer 18, which is sealed by a reflective surface 19 towards the Schlieren lens 15, said reflective surface being formed e.g. by a metal film or other mechanical elements such as reeds. Furthermore, the surface light modulator 13 includes a active addressing matrix 20, which can consist of a monolithic integrated array of MOS transistors with associated pairs of control electrodes. Typically, the addressing matrix 20 will comprise 2000× 2000 pixels. Each pixel or surface area 19a, 19b, . . . of the reflective surface 19 of the addressing matrix 20 has associated therewith two transistors with one or several pairs of electrodes forming each a diffraction grating with one or several grating periods with the viscoelastic layer 18 and its reflective surface 19.

When a surface area 19a, 19b, . . . is addressed by applying opposed voltages to the two electrodes of a pair of electrodes of the respective surface area (logical "1"), the reflective surface 19 will assume a form having an approximately sinusoidal cross-section. If not addressed, the respective surface area 19a, 19b, . . . will be flat. For a positive mode, the filter device 18 can be constructed such that it will filter out the zeroth-order light coming from the surface light modulator 13 and permit the light of at least one of the higher orders of diffraction to pass, whereby the areas of the projection of the surface light modulator 13 which correspond to the addressed modulator areas will be imaged by means of illumination on the light-sensitive layer 6 to be illuminated.

Deviating from the above, the filter device 18 can, for the purpose of realizing the socalled negative mode, also be constructed in such a way that it will only permit the passage of zeroth-order light coming from the surface light modulator 13, this being shown in FIG. 2. Hence, only the undiffracted light reflected by the non-addressed surface areas 19a, 19b, . . . of the surface light modulator 13 will be permitted to pass via the projection lens 16 to the model 6 or the electronic element or the structure so that the projection image in the negative mode will correspond to the non-addressed areas.

In the system which has just been described with reference to FIG. 2, the introduction of light from the laser light source 2 via the optical unit 4 and the mirror device 17 into the system is effected symmetrically with respect to the optical axis of the lenses 15, 16 so that the light coming from the virtual point light source P' and falling onto the surface light modulator 13 will fall onto said surface light modulator 13 essentially perpendicularly.

As will be explained hereinbelow with respect to FIG. 3, it is, however, possible to obtain an oblique incidence of light when a non-symmetrical introduction of light is effected.

Figure 3:
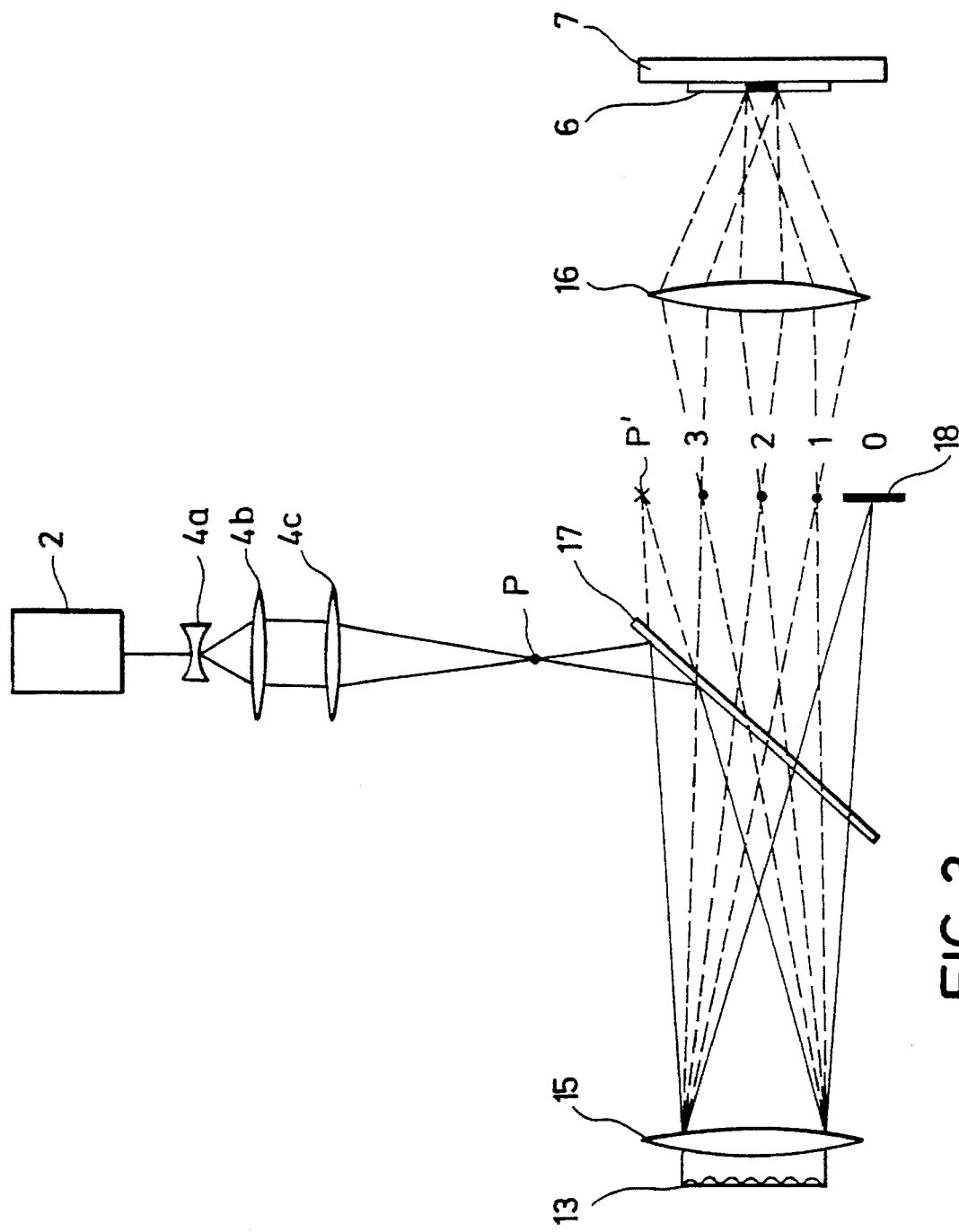
FIG. 3 shows a detailed representation of a second embodiment of the illumination device according to the present invention.

In the embodiment according to FIG. 3, which corresponds to the embodiment of FIG. 2 with the exception of the deviations described hereinbelow, the semireflecting mirror 17 defining the mirror device in said FIG. 3 is arranged at an angle deviating from the 45° angle. The distance of the focussing point P of the focussing device 4c from the semireflecting mirror 17 is again chosen such that the virtual point light source P' associated with the point P is located in the focal plane of the Schlieren lens 15. However, due to the inclination of the semireflecting mirror 17, the virtual point light source P' will here be located outside of the optical axis of the lenses 15, 16. This will have the effect that the light of the virtual point light source P' will fall on the surface light modulator 13 at an oblique angle of incidence.

A filter device 18 constructed as a shutter and used for filtering out the zeroth-order light is, in relation to the optical axis, positioned symmetrically with the virtual point light source P'.

The first, second and third orders of diffraction of a lateral spectrum are picked up by the projection lens 16 and imaged on the model 6, which, in turn, is arranged on the projection table 7.

If, as in the case of the arrangement shown in FIG. 3, the operating mode is the positive mode, a projection with a fine structure will be obtained. If a symmetrical arrangement is used, this type of arrangement being shown e.g. in FIG. 2, only a small number of diffraction orders can be imaged due to the numerical aperture of the projection lens 16, and this will result in a comparatively strongly marked fine structure of the projection. In order to obtain an illumination which is as homogeneous as possible and which has only a light fine structure, the largest possible number of higher diffraction orders will have to be included in the imaging process. When the asymmetrical arrangement according to FIG. 3 is used, higher orders of diffraction from one of the two sides of the spectrum can be imaged with an unchanging entrance pupil of the projection lens 16, and this will improve the homogeneity of the image formed.

Deviating from the use of a semireflecting mirror, this type of mirror being shown in connection with the embodiment according to FIG. 3, it is also possible to provide a mirror, which should then be provided only in the area in which the light coming from the focussing device 4c falls on the mirror device, said area being shown in FIG. 3, whereas the residual area should be kept free so that the first to third orders of diffraction can pass through.

In the embodiments according to FIG. 2 and 3, the light coming from the laser light source 2 is focussed in only one point P, a single virtual point light source P' corresponding to said point P.

Figure 4:
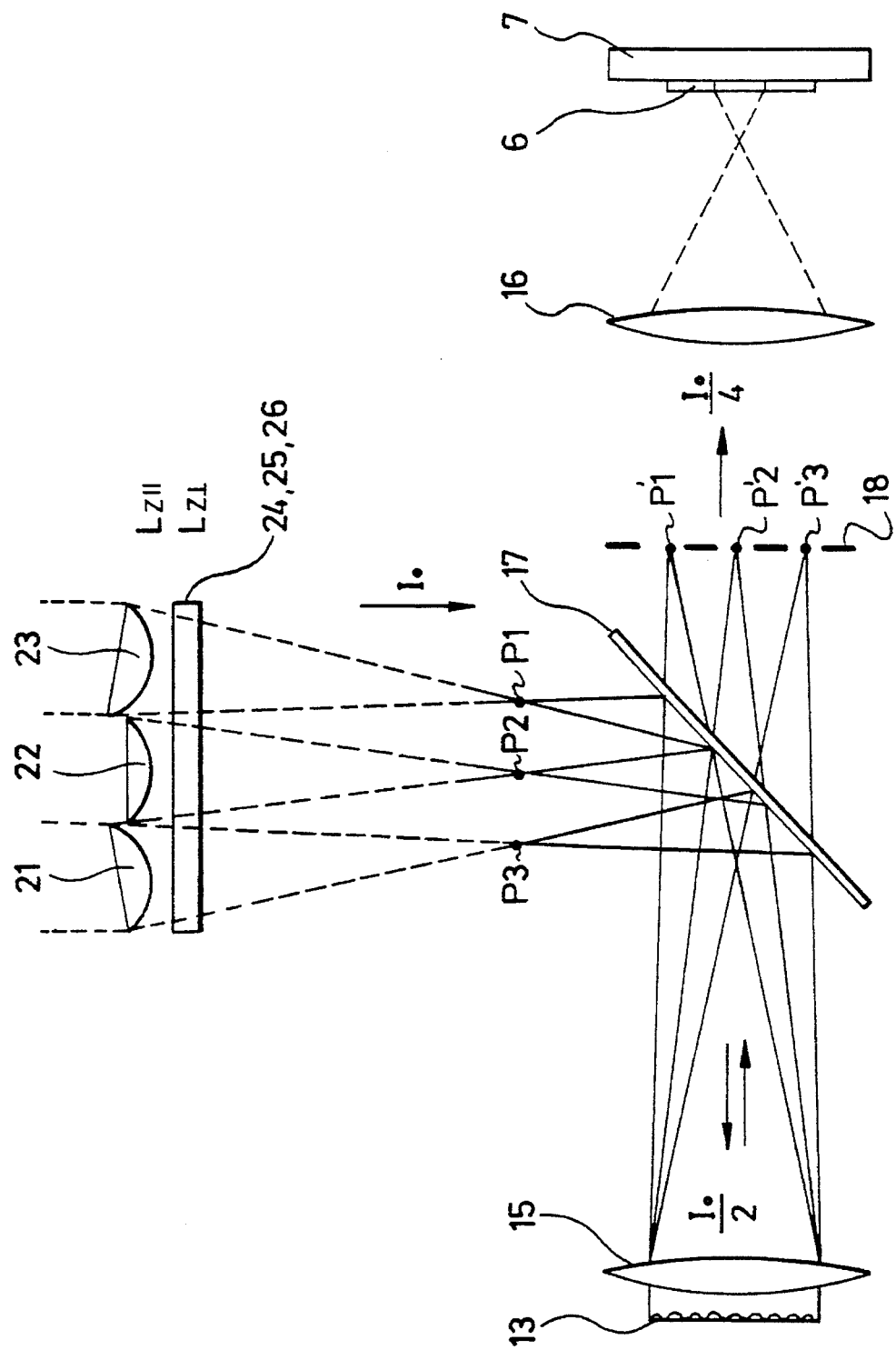
FIG. 4 shows a detailed representation of a third embodiment of the illumination device according to the present invention.

Deviating from the above, a plurality of essentially point-symmetrical point light sources (9 point light sources) is produced in the third embodiment according to FIG. 4, said point light sources illuminating each the whole surface of the surface light modulator 13.

For this purpose, the illuminating optical unit 4 comprises, in addition to the beam expansion optical systems 4a, 4b, two cylindrical lens system groups 21 to 23, 24 to 26 which are arranged vertically with respect to one another.

The cylindrical lenses 21, 22, 23 which are located in the beam path at the front are oriented parallel to the phase structure and, consequently, in the y-direction, whereas the cylindrical lenses 24, 25, 26 following said first-mentioned cylindrical lenses are arranged at right angles to the phase structure. These cylindrical lens systems, which are placed one behind the other, will focus the light in nine points, three of said points, P1, P2, P3, being shown in the drawing. The position of the focussing points P1, P2, P3 in relation to the mirror device 17 defined by the semireflecting mirror is of such a nature that, when reflected by said mirror device 17, the focussing points will have associated therewith point light sources P1', P2', P3' which are located in the focal plane of the Schlieren lens 15.

During operation, the positioning table 7 of all embodiments is continuously moved in a predetermined direction of movement, and in the course of this movement an image of overlapping partial images of the whole structure to be imaged will be formed on the model 6 by pulsing the excimer laser light source 2.

The addressing matrix 20 of the surface light modulator 13 will normally comprise a plurality of pixels which are not capable of functioning.

In a system operating in a positive mode, the defective pixels are acted upon by a logical "zero".

In a system operating in a negative mode, the defective pixels are treated in such a way that they will not longer reflect. This can, for example, be done by covering them with paint or by destroying the reflective surface thereof.

The fact that each structure on the model 6 is produced by overlapping partial images guarantees that each part of the structure to be illuminated will be illuminated at least once by a pixel in working order or by a surface area in working order.

The production of the whole illuminated structure during continuous displacement of the positioning table 7 will not result in unsharpness, since the pulse duration of the pulsed excimer laser light source 2 is shorter than the minimum dimension of the structure to be produced divided by the displacement rate of the positioning table 7.

The data structure for controlling the addressing matrix 20 corresponds essentially to the data structure for controlling raster-orientated laser beam or electron beam units according to the prior art. An essential advantage resulting from the use of the illumination device according to the present invention is to be seen in the fact that the time required for transmitting large volumes of data can be reduced to an almost arbitrary extent on the basis of the subdivision of the addressing matrix 20 and on the basis of parallel programming of submatrixes of e.g. 16 or 32 strips. An additional advantage of the illumination device 1 according to the present invention, which includes the addressing matrix 20, is to be seen in the fact that, for the purpose of illuminating repetitive structures, such as regular arrays of integrated circuits on a silicon wafer, the addressing matrix 20 will have to be programmed only once and the programmed image will have to be stored only once for all identical structures.

It is possible to provide the illumination device 1 according to the present invention with an autocalibration system and with a system for fine adjustment of the models 6 in the case of direct writing. For this purpose, reference marks are provided on the positioning table 7 and on the model 6, and the addressing matrix 20 is used as a programmable reference mark. By means of autocalibration, magnification errors of the projecting optical unit 5 as well as all positioning errors can be compensated.

We claim:

1. An illumination device for producing models used for manufacturing electronic elements, or for direct illumination of wafers or substrates during photolithographic steps for producing the electronic elements, or for direct illumination of structures including light-sensitive layers, comprising:

a pulsed laser light source;

a pattern generator;

an object onto which light emitted by said laser light source is focussed, said object being selected from the group consisting of a model, a disk, a substrate and a structure;

said pattern generator includes an optical Schlieren system and an active, matrix-addressable surface light modulator, said surface light modulator has a reflective surface having addressed surface areas which diffract incident light and non-addressed surface areas which reflect incident light, said Schlieren system comprises a Schlieren lens arranged on a side of said surface light modulator, a projection lens facing away from said surface light modulator, and a mirror device which is arranged between said Schlieren lens and said projection lens for directing light coming from said pulsed laser light source onto said reflective surface on said surface light modulator, wherein said Schlieren lens is arranged from said surface light modulator a distance less than a focal length of said Schierlen lens, focussing means for focussing the light coming from said light source in at least one point which is spaced apart from said mirror device and which is adapted to have associated therewith at least one virtual point light source by reflecting a point at said mirror device, a filter device arranged in a diffraction image plane of the virtual point light source between said Schlieren lens and said projection lens, said filter device being designed to filter out diffracted light reflected by the addressed surface areas of said surface light modulator and permit undiffracted light reflected by said non-addressed surface areas to pass through said projection lens to the model, the disk, the substrate, or the structure, and to filter out undiffracted light reflected by said non-addressed surface areas of said surface light modulator, and permit said diffracted light reflected by said addressed surface areas to pass through said projection lens to the model, the disk, the substrate, or the structure, and a displaceable positioning table capable of having the model, the disk, the substrate or the structure secured thereon in position so that a sharp image of said surface areas of said surface light modulator can be formed on the model, the disk, the substrate, or the structure, wherein said pulsed laser light source is constructed such that a pulse duration of said pulsed laser light source is shorter than a minimum structural dimension of the model, the disk, the substrate or the structure divided by a displacement rate of said positioning table, and wherein, during the displacement of said positioning table, the model, the disk, the substrate or structure are composed of a plurality of partial images by adequate addressing of said surface light modulator.

2. An illumination device according to claim 1, wherein said mirror device includes a semireflecting mirror arranged at an angle of 45° relative to an optical axis determined by said Schierlen lens and said projection lens.

3. An illumination device according to claim 1, wherein said filter device is arranged in a focal plane of said Schlieren lens, and said focussing device produces a point at which the light from said light source is focussed, the point being located a distance from said mirror device so that a virtual point light source associated with the point by means of reflection at said mirror device is located in the focal plane of said Schlieren lens.

4. An illumination device according to claim 1, wherein said focussing device produces a point at which the light from said light source is focussed, the point being located a distance from said mirror device so that a virtual point light source associated with the point by means of reflection at said mirror device is produced with a first displacement relative to a focal plane of said Schlieren lens in a direction of said Schlieren lens, and said filter device being arranged with a second displacement relative to the focal plane of said Schlieren lens in a direction of the projection lens, said second displacement depending on said first displacement.

5. An illumination device according to claim 1, wherein said focussing device and said mirror device are arranged such that light will fall at an oblique angle onto the reflective surface of said surface light modulator so that undiffracted light is reflected at an angle to an optical axis of said Schierlen lens and said projection lens, and said filter device permits a lateral spectrum of light of a first order of diffraction and of higher orders of diffraction to pass to said projection lens to filter out zeroth-order light.

6. An illumination device according to claim 1, wherein said pulsed laser light source is an excimer laser light source.

7. An illumination device according to claim 1, wherein a surface area of said surface light modulator has associated therewith two transistors, each transistor being provided with at least one pair of control electrodes and being capable of producing at least one diffraction grating with said reflective surface and a viscoelastic control layer covered by said reflective surface.

8. An illumination device according to claim 1, further comprising an automatic loading and unloading device for wafers or substrates disposed adjacent to the displaced positioning table to fully automate illumination of a batch of wafers or substrates.

9. An illumination device according to claim 1, further comprising preadjustment means and fine adjustment means for permitting accurate, repeated illuminations of the substrates during a production process.

10. An illumination device according to claim 9, wherein said surface light modulator is used as a programmable reference mark during preadjustment and fine adjustment, said programmable reference mark being located on said surface light modulator.

11. An illumination device according to claim 1, wherein said reflective surface of said surface light modulator is covered with a liquid-crystal layer, and wherein said addressable surface areas cause a phase displacement and a diffraction of incident light.

12. An illumination device according to claim 1, wherein said surface light modulator is provided with a reflective surface including addressable mechanical elements disposed thereon so that bending of said elements causes a phase displacement and a diffraction of the light.

13. An illumination device according to claim 12, wherein said mechanical elements include reeds disposed on said surface light modulator which are adapted to be bent and which are provided with a reflecting surface.

\* \* \* \* \*